(12) United States Patent
Nguyen et al.

(10) Patent No.: US 7,996,035 B2
(45) Date of Patent: Aug. 9, 2011

(54) MATCHING CIRCUIT FOR ADAPTIVE IMPEDANCE MATCHING IN RADIO

(75) Inventors: Hien Nguyen, San Diego, CA (US);
Vijay Parpia, Sunnyvale, CA (US); Yi Zhou, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 107 days.

(21) Appl. No.: 12/542,238

(22) Filed: Aug. 17, 2009

(65) Prior Publication Data
US 2011/0039504 A1 Feb. 17, 2011

(51) Int. Cl.
*H04M 1/00* (2006.01)
(52) U.S. Cl. ............. 455/553.1; 455/552.1; 455/78; 455/73
(58) Field of Classification Search ........... 455/552.1, 455/553.1, 78, 73
See application file for complete search history.

(56) References Cited

U.S. PATENT DOCUMENTS

| | | | | |
|---|---|---|---|---|
| 5,479,480 | A | * | 12/1995 | Scott ...................... 455/425 |
| 6,845,126 | B2 | | 1/2005 | Dent et al. |
| 6,961,368 | B2 | | 11/2005 | Dent et al. |
| 7,528,674 | B2 | | 5/2009 | Kato et al. |
| 2007/0210899 | A1 | * | 9/2007 | Kato et al. ......... 340/310.15 |
| 2009/0109880 | A1 | * | 4/2009 | Kim et al. ............ 370/278 |
| 2010/0210299 | A1 | * | 8/2010 | Gorbachov ........... 455/552.1 |

OTHER PUBLICATIONS

Bennett Liles, "Technology Showcase: Wireless Systems", http://svconline.com/mag/avinstall_wireless_systems/, May 1, 2004.

* cited by examiner

*Primary Examiner* — Lewis G West
(74) *Attorney, Agent, or Firm* — John L. Rogitz

(57) ABSTRACT

An impedance matching circuit for a radio receives antenna signals and has its matching elements, such as capacitors, progressively switched into the circuit, with the matching element configuration resulting in the highest RSSI being subsequently used until a succeeding test or antenna impedance change. The effect of the matching circuit is accounted for in the transmitter calibration routine so that the matching circuit works for both half duplex and full duplex.

19 Claims, 4 Drawing Sheets

US 7,996,035 B2

MATCHING CIRCUIT FOR ADAPTIVE IMPEDANCE MATCHING IN RADIO

FIELD OF THE INVENTION

The present invention relates generally to circuits for adaptively matching impedance in a radio.

BACKGROUND OF THE INVENTION

Radios are commonly used in wireless notebooks, wireless consumer electronics devices such as mobile telephones, etc. to provide wireless connectivity to a network. As understood herein, the impedance of the radio's antenna can be affected by the placement of a user's hand on the device and by other nearby objects, which can degrade radio performance.

As further understood herein, not only would it be advantageous to address the problem noted above but to do so in a way that works not only in a half-duplex mode, in which transmitter performance is not necessarily affected by a change in antenna receiver-side impedance, but in a full-duplex mode as well, in which the transmitter performance typically is affected as antenna impedance changes.

SUMMARY OF THE INVENTION

A system has a transceiver communicating with an antenna and a matching network in a communication path between the antenna and transceiver. The matching network includes at least a first set of matching elements switchable from a first configuration, in which at least a first matching element in the set is not in the communication path, and a second configuration, in which the first matching element is in the communication path. A processor controls the matching network to establish the first and second configurations and to determine first and second respective measures of performance. The processor establishes the configuration having the best measure of performance.

The matching elements can be capacitors, inductors, or resistors. In some embodiments the measure of performance is received signal strength indication (RSSI) and more specifically may be an average RSSI.

Some examples envision that the system can operate in at least first and second frequency bands. In this case the matching network can include least a second set of matching elements, with the first set of matching elements being selected by the processor when the system operates in the first frequency band and the second set of matching elements being selected by the processor when the system operates in the second frequency band.

The transmitter can be calibrated as more fully described below to account for the first and second configurations to facilitate full duplex mode operation while the matching network is in use. A set of matching elements can establishes a π configuration or a "T" configuration or an "L" configuration, and present principles may be used, without limitation, with PCS, TDMA, GSM, Edge, UTMS, CDMA 1x-RTT, 1X-EVDO, 802.11a, 802.11b, 802.11g, 802.11n, Wimax, LTE.

In another aspect, a system includes a transceiver communicating with an antenna. The transceiver includes a receiver and a transmitter. A matching circuit is in a communication path between the antenna and transceiver. The matching circuit includes a first set of matching elements switchable from a first configuration, in which at least a first matching element in the set is not in the communication path, and a second configuration, in which the first matching element is in the communication path. A processor controls the matching circuit to establish the first and second configurations and to determine first and second respective measures of performance. The processor establishes the configuration having the best measure of performance. The transmitter can be configured to account for the matching circuit such that the matching circuit is useful in full duplex modes.

In still another aspect, a method includes determining whether an index of receiver performance of a receiver fails a threshold. Only of the index fails the threshold, the method then includes establishing plural configurations for an impedance matching circuit communicating with a radio antenna and determining an index of receiver performance for each configuration. The method includes establishing one of the configurations in circuit based on the act of determining an index of receiver performance.

The act of establishing plural configurations may be executed only when the receiver is not actively receiving a data call. Also, a calibration of a transmitter associated with the receiver may be established to account for an effect of the impedance matching circuit. Furthermore, the method may include, in non-limiting examples, determining a modulation currently being used in connection with the receiver, with the threshold depending on the modulation currently being used.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
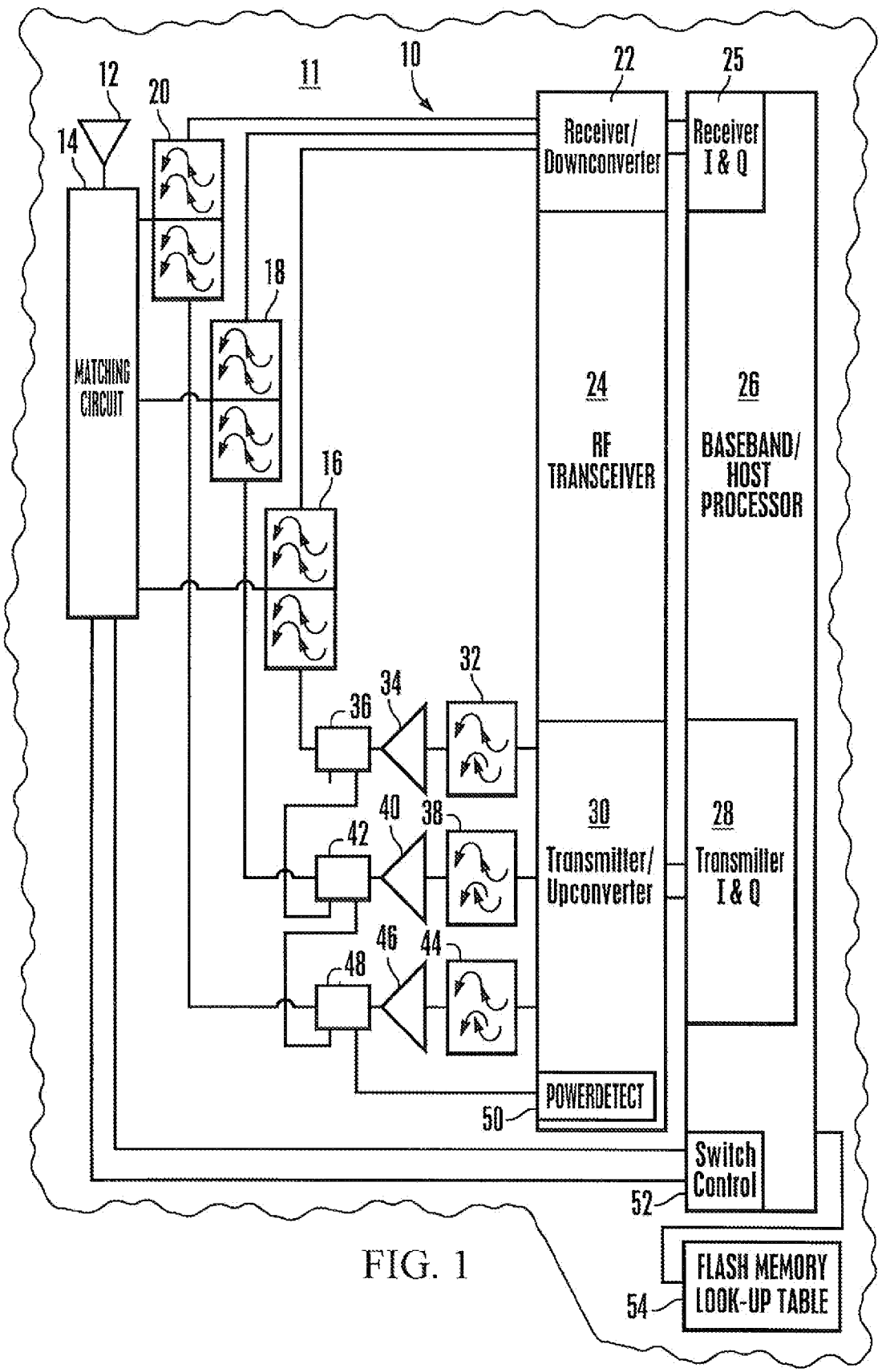
FIG. 1 is a block diagram of an example radio with the present matching circuit.

Referring initially to FIG. 1, a radio 10 that may be incorporated in a portable electronic device 11 such as a portable computer or wireless telephone includes an antenna 12 sending signals to and receiving signals from a matching circuit 14, an example of which is described further below in reference to FIG. 2. The matching circuit 14 may be connected to one or more filter-type components such as duplexers. In the example shown the matching circuit 14 communicates with a cellular duplexer 16, a personal communication service (PCS) duplexer 18, and a long-term evolution (LTE) duplexer or transmit/receiver (T/R) switch 20.

In turn, each of the components 16-20 communicates with a receiver/downconverter 22 of a radiofrequency (RF) transceiver 24. The receiver/downconverter converts signals in the RF domain to intermediate frequency (IF), which is sent to a receiver I&Q demodulator 25 of a host processor 26 for demodulation of the IF to baseband, which is processed by the host processor.

The apparatus disclosed thus far also has a transmitter side, and more particularly a transmitter I&Q modulator 28 is provided in the processor 26 for modulating baseband signals to IF, which are upconverted to the RF domain by an upconverter 30 in the transceiver 24. When three transmission schemes are contemplated as shown in the non-limiting example of FIG. 2, the upconverter 30 sends RF signals to a cellular filter 32 which communicates with a cellular power amplifier 34, which in turn may be connected to a cellular directional coupler 36. The cellular directional coupler 36 communicates with the cellular duplexer 16 as shown.

Also, the upconverter 30 sends RF signals to a PCS filter 38 which communicates with a PCS power amplifier 40, which in turn may communicate with a PCS directional coupler 42. The PCS directional coupler 42 communicates with the PCS duplexer 18 as shown. In the example of FIG. 2, the upconverter 30 sends RF signals to a LTE filter 44 which communicates with a LTE power amplifier 46, which in turn may communicate with a LTE directional coupler 48. The LTE directional coupler 48 communicates with the LTE duplexer or T/R switch 20 as shown. If desired, all three couplers 36, 42, 48 may communicate with each other, and at least one coupler 48 may communicate with a power detector 50 in the transceiver 24 for purposes to be shortly disclosed.

Completing the description of FIG. 1, the host processor 26 may execute a switch control register or I/O 52 for configuring the matching circuit 14 in accordance with principles below. Also, the processor 26 may access a memory such as disk-based memory or solid state memory such as a flash memory 54 that can store, among other things, a lookup table described further below.

Figure 2:
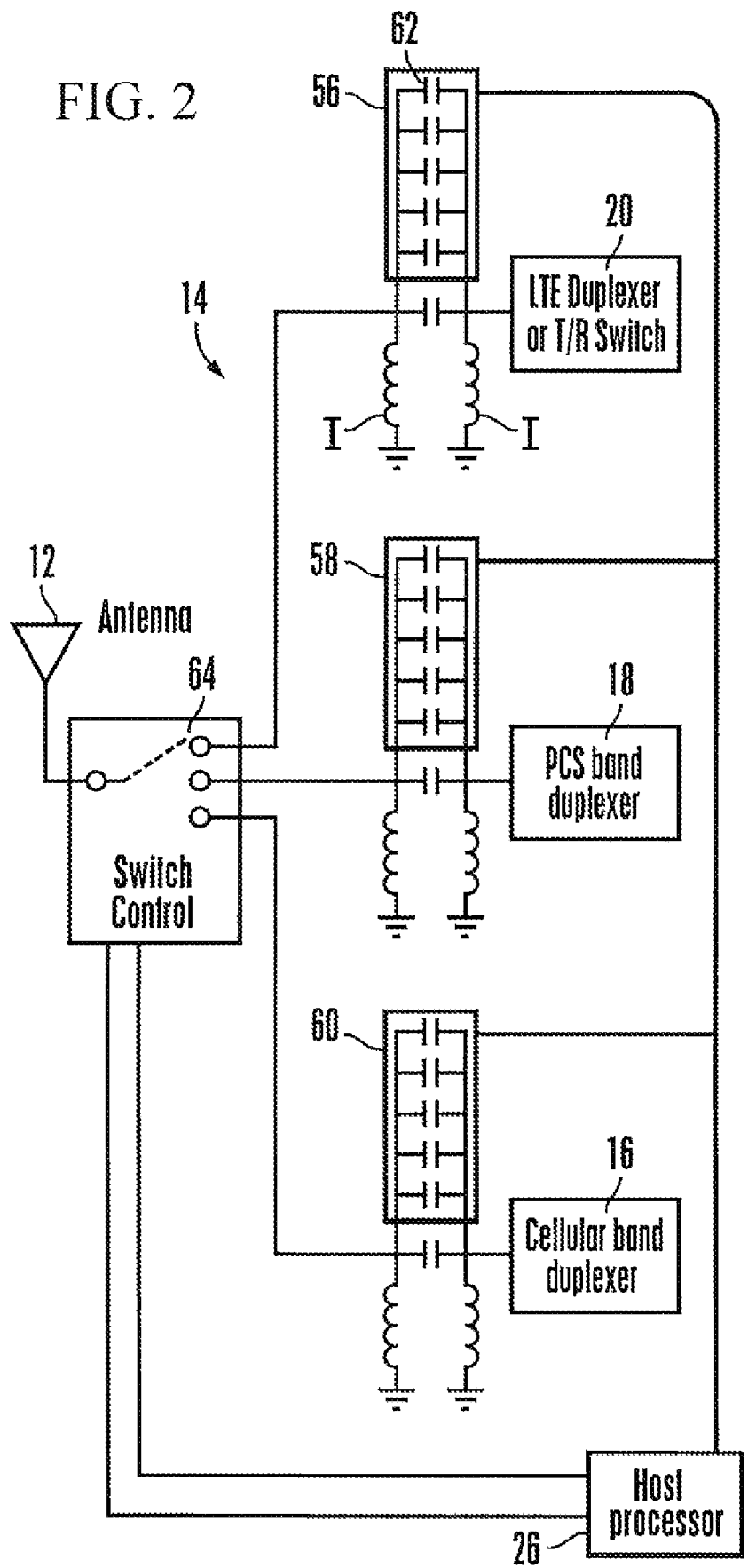
FIG. 2 is a block diagram of an example matching circuit in accordance with present principles.

Now referring to FIG. 2, details of an example matching circuit 14 may be seen. The matching circuit 14 may have only a single set of matching elements but in the example shown, the matching circuit 14 has three sets 56, 58, 60 of matching elements 62, one set communicating with a respective duplexer 16-20 as shown. A switch 64 controlled by the processor 26 establishes which set 56-60 of matching elements communicates with the antenna 12. It will readily be appreciated that the processor 26 configures the switch 64 as appropriate for the particular mode the radio 10 is being operated in. In this way, one otherwise large and comparatively bulky set of matching elements is avoided, because the respective sets 56-60 of matching elements can be advantageously smaller sized since they must be adapted to only the frequency band they happen to correspond to, e.g., cellular, PCS, or LTE.

In the example of FIG. 2, the matching elements in a single set are capacitors and are connected in parallel to each other as shown to establish a π-shaped configuration. Alternatively, a "T" shaped configuration or an "L" shaped configuration for the matching elements may be used as described further below in reference to FIGS. 5-7. Instead of capacitors, inductors or resistors less preferably may be used as matching elements. Each set 56-60 of matching elements may be grounded as shown through respective opposed inductors "I". If desired the inductors "I" may also be switched into and out of the circuit as part of configuring the matching circuit 14.

Figure 3:
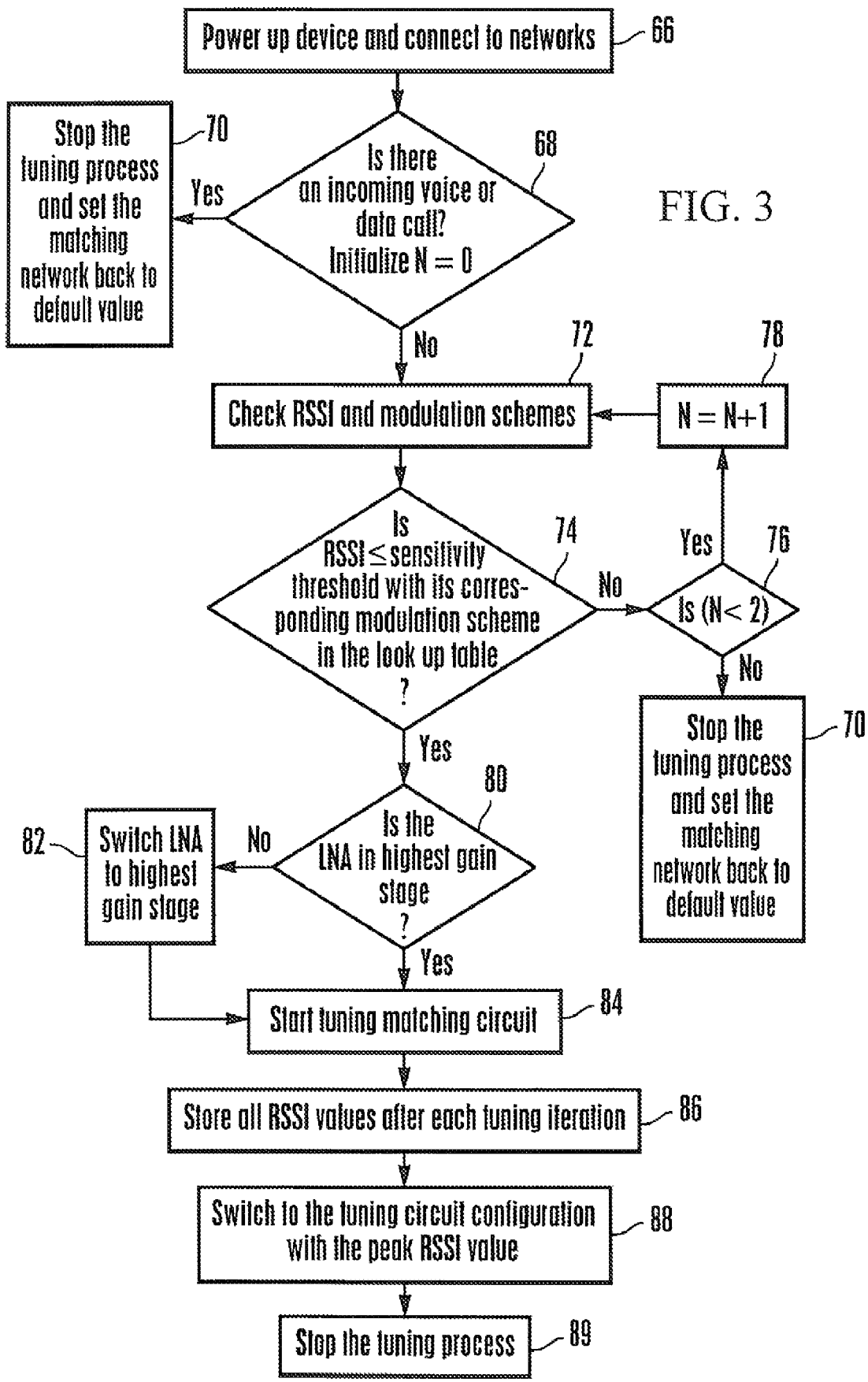
FIG. 3 is a flow chart of example logic that is embodied by a matching circuit.

Example logic of the processor 26 in configuring the matching circuit 14 is shown in FIG. 3. Commencing at power up and network connection state 66, in some embodiments the logic can move to decision diamond 68 to determine whether an active call or other data communication is in progress through the radio 10. Also, a counter "n" can be initialized to zero.

If a call is in progress the logic may move to block 70 to prevent the below-described tuning process until the call is over and to establish a default configuration for the network of matching elements in the matching circuit 14. In other embodiments the tuning process may proceed regardless of whether a call is active.

In the example shown, when no call is active (or immediately upon power up when the active call test at decision diamond 68 is omitted) the logic moves to block 72 to check a measure of performance. In one embodiment the processor 26 determines received signal strength indicator (RSSI) in the transceiver. In other implementations other measures of performance may be used, e.g., signal to noise ratio, bit error rate, etc.

Also at block 72 the processor 26 determines the current modulation protocol in use. In the example of FIGS. 1 and 2 the current protocol would be cellular or PCS or LTE.

Figure 4:
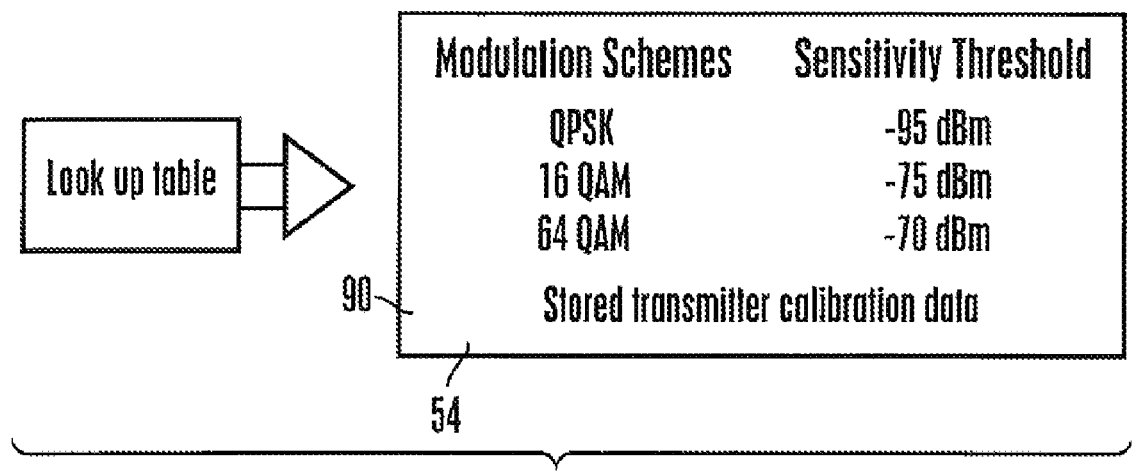
FIG. 4 is a schematic diagram of a threshold lookup table.

Proceeding to decision diamond 74 the processor 26 determines whether, for the modulation protocol in use, the measure of performance (e.g., RSSI) violates a sensitivity threshold. This may be done by accessing the memory 54 to enter a lookup table of values of RSSI thresholds for the current modulation protocol in use. An example table is discussed further below in reference to FIG. 4. If desired, the looked up threshold may be compared against current instantaneous RSSI but in the example shown in FIG. 3 the processor 26 calculates an average RSSI over multiple cycles, e.g., two or more and compares the average actual RSSI against the threshold at decision diamond 74.

If the actual RSSI does not violate the threshold, in some implementations, to limit excessive processing the logic may flow to decision diamond 76 to determine whether the number of recent RSSI tests at decision diamond 74 equals a threshold number, e.g., 2. If not, "n" is incremented by unity at block 78 and the logic loops back to block 72. On the other hand, if "n" meets the threshold the logic moves to block 70.

In the event that the RSSI value fails to meet the threshold at decision diamond 74, in some embodiments the logic may include another test at decision diamond 80 to determine if the low noise amplifier (LNA) gain of the receiver is set to its highest state, setting it to the highest state at block 82 if not. In any case, the tuning of the selected set 56-60 of matching elements 62 in the matching circuit 14 begins at block 84, in which a first matching element 62 is switched into the circuit and RSSI recorded at block 86, then the second element, and so on, recording RSSI values as the matching elements are progressively switched into the circuit one at a time. If desired, in less preferred embodiments the progressive switching may include switching in two or more elements 62 at a time. When all matching elements 62 have been switched in accordingly, the configuration with the highest RSSI is selected at block 88. Thus, for example, if the first three elements 62 result in the highest RSSI then that is the configuration selected for the matching circuit 14 at block 88. The process ends at state 89.

An example non-limiting lookup table 90 that may be stored in the medium 54 and used at block 74 as described above is shown in FIG. 4.

Present principles envision use in a number of communication protocols including, without limitation, PCS, TDMA, GSM, Edge, UTMS, CDMA 1x-RTT, 1X-EVDO, 802.11a, 802.11b, 802.11g, 802.11n, Wimax, LTE. Also, present principles envision use in both half-duplex modes and full duplex modes, and in this latter regard the degradation of transmitter performance is avoided by incorporating the effects of the matching circuit 14 in the transmitter calibration routines.

Specifically, during transmitter calibration the above-described receiver matching elements are switched in and out of the circuit in various combinations, singly and in groups. This results in changes of the transmitter impedance, which in turn can affect transmitter output power, gain, spurious emissions, and so on. Accordingly, for each matching element combination the transmitter is tuned during calibration to optimize transmitter performance. The transmitter chain may be tuned by establishing particular gain, input power, etc. for each impedance presented by each matching element combination. The transmitter settings for each impedance may be stored in a calibration table which can be accessed during operation so that as matching elements in the receiver are switched in and out of the circuit as described above, the transmitter settings corresponding to the related impedances are changed to optimize transmitter performance.

Figure 5:
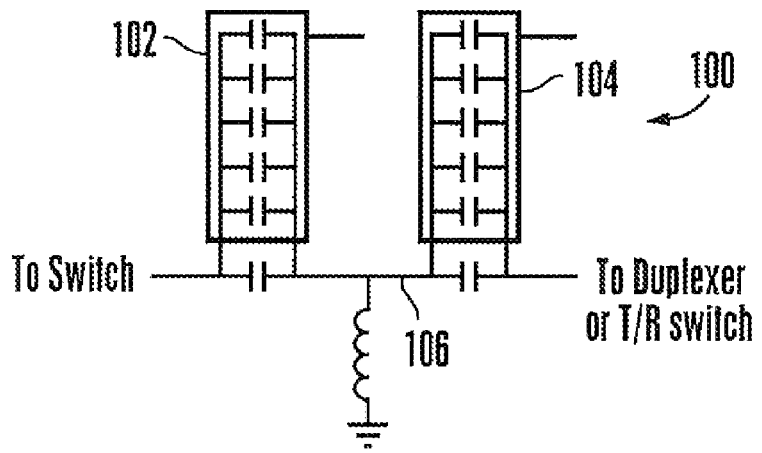
FIGS. 5-7 show alternative matching circuits.
Figure 6:
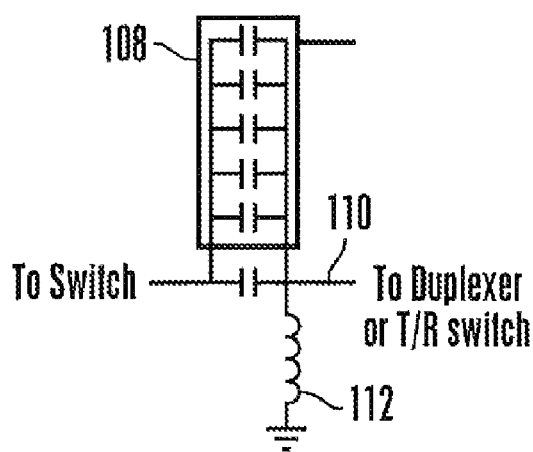
Figure 7:
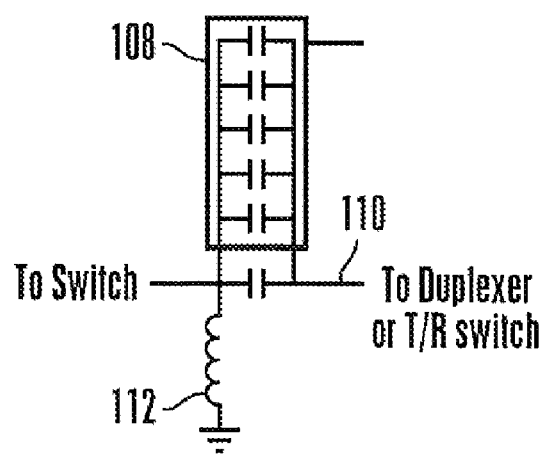

FIG. 5 shows a "T"-style matching circuit 100 in which two sets 102, 104 of matching elements are connected to a common cross line 106, one end of which is connected to the switch and the other end of which is connected to the duplexer or T/R switch. In FIGS. 6 and 7, "L"-style circuits are shown in which a matching circuit 108 is connected to cross-line 110 which in turn is connected to the switch and the duplexer or T/R switch as shown. The difference between FIGS. 6 and 7 is that in FIG. 6, the cross-line 110 is grounded through an inductor 112 on the duplexer/T/R switch side whereas in FIG. 7 it is grounded through the inductor 112 on the switch side.

While the particular MATCHING CIRCUIT FOR ADAPTIVE IMPEDANCE MATCHING IN RADIO is herein shown and described in detail, it is to be understood that the subject matter which is encompassed by the present invention is limited only by the claims.

For example, all or parts of the matching circuit 14 may be moved into the integrated circuit of the transceiver. Further, all or parts of the logic of FIG. 3 may be implemented as part of a software routine.

What is claimed is:

1. A system comprising:
   at least one antenna;
   at least one transceiver communicating with the antenna;
   a matching network in a communication path between the antenna and transceiver, the matching network comprising:
      at least a first set of matching elements switchable from a first configuration, in which at least a first matching element in the set is not in the communication path, and a second configuration, in which the first matching element is in the communication path; and
   a processor controlling the matching network to establish the first and second configurations and to determine first and second respective measures of performance, the processor establishing the configuration having the best measure of performance, wherein first and second sets of matching elements are connected to a common cross line, a first part end of cross line being connected to a switch establishing the first and second configurations, a second part of the cross line being connected to a duplexer or transmit/receive (T/R) switch, the cross line being grounded between the first and second matching elements.

2. The system of claim 1, wherein the matching elements are capacitors.

3. The system of claim 1, wherein the matching elements are inductors or resistors.

4. The system of claim 1, wherein the measure of performance is received signal strength indication (RSSI).

5. The system of claim 4, wherein the measure of performance is an average RSSI.

6. The system of claim 1, wherein the system can operate in at least first and second frequency bands and the matching network further comprises at least a second set of matching elements, the first set of matching elements being selected by the processor when the system operates in the first frequency band, the second set of matching elements being selected by the processor when the system operates in the second frequency band.

7. The system of claim 1, wherein the transceiver includes a receiver and a transmitter, and the transmitter is calibrated to account for the first and second configurations.

8. The system of claim 1, wherein the cross line is grounded between the first and second sets of matching elements through an inductor.

9. The system of claim 6, wherein the first and second frequency bands are selected from PCS, TDMA, GSM, Edge, UTMS, CDMA 1x-RTT, 1X-EVDO, 802.11a, 802.11b, 802.11g, 802.11n, Wimax, LTE.

10. A system comprising:
    at least one antenna;
    at least one transceiver communicating with the antenna, the transceiver including a receiver and a transmitter;
    a matching circuit in a communication path between the antenna and transceiver, the matching circuit comprising:
       at least a first set of matching elements switchable from a first configuration, in which at least a first matching element in the set is not in the communication path, and a second configuration, in which the first matching element is in the communication path; and
    a processor controlling the matching circuit to establish the first and second configurations and to determine first and second respective measures of performance, the processor establishing the configuration having the best measure of performance, the transmitter being configured to account for the matching circuit such that the matching circuit is useful in full duplex modes, wherein the first set of matching elements is connected to a cross line, the cross line being connected to a switch establishing the first and second configurations and to a duplexer or transmit/receive (T/R) switch, the cross-line being grounded through an inductor between the duplexer or T/R switch and the first set matching elements.

11. The system of claim 10, wherein the matching elements are capacitors.

12. The system of claim 10, wherein the measure of performance is received signal strength indication (RSSI).

13. The system of claim 10, wherein the processor never reconfigures the matching circuit when the transceiver is actively receiving or sending a call.

14. The system of claim 10, wherein the system can operate in at least first and second frequency bands and the matching circuit further comprises at least a second set of matching elements, the first set of matching elements being selected by the processor when the system operates in the first frequency band, the second set of matching elements being selected by the processor when the system operates in the second frequency band.

15. The system of claim 10, wherein the first set of matching elements establishes a π configuration or a "T" configuration or an "L" configuration.

16. The system of claim 14, wherein the first and second frequency bands are selected from PCS, TDMA, GSM, Edge, UTMS, CDMA 1x-RTT, 1X-EVDO, 802.11a, 802.11b, 802.11g, 802.11n, Wimax, LTE.

17. A method comprising:
    determining whether an index of receiver performance of a receiver fails a threshold;
    only of the index fails the threshold, establishing plural configurations for an impedance matching circuit communicating with a radio antenna;

determining an index of receiver performance for each configuration;
establishing one of the configurations in circuit based on the act of determining an index of receiver performance; and
executing the act of establishing plural configurations only when the receiver is not actively receiving a data call, wherein the impedance matching circuit includes at least a first set of matching elements and a configuration switch for establishing at least two of the configurations, wherein the first set of matching elements is connected to a cross line, the cross line being connected to the configuration switch and to a duplexer or transmit/receive (T/R) switch, the cross-line being grounded through an inductor between the configuration switch and the first set matching elements.

18. The method of claim 17, comprising establishing a calibration of a transmitter associated with the receiver to account for an effect of the impedance matching circuit.

19. The method of claim 17, comprising determining a modulation currently being used in connection with the receiver, the threshold depending on the modulation currently being used.

* * * * *